(12) United States Patent
Li et al.

(10) Patent No.: US 8,021,902 B2
(45) Date of Patent: Sep. 20, 2011

(54) METHOD FOR FABRICATING LIGHT EMITTING DIODE

(75) Inventors: Qun-Qing Li, Beijing (CN); Kai-Li Jiang, Beijing (CN); Shou-Shan Fan, Beijing (CN)

(73) Assignees: Tsinghua University, Beijing (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 205 days.

(21) Appl. No.: 12/584,386

(22) Filed: Sep. 3, 2009

(65) Prior Publication Data

US 2010/0221852 A1 Sep. 2, 2010

(30) Foreign Application Priority Data

Feb. 27, 2009 (CN) .......................... 2009 1 0105809

(51) Int. Cl.
*H01L 21/00* (2006.01)
(52) U.S. Cl. ..... 438/22; 438/99; 438/237; 257/E21.158; 977/742
(58) Field of Classification Search .................. 438/20, 438/22, 99, 237; 257/E21.158; 977/742
See application file for complete search history.

(56) References Cited

U.S. PATENT DOCUMENTS

| 7,045,108 | B2 | 5/2006 | Jiang et al. |
| 7,173,289 | B1 | 2/2007 | Wu et al. |
| 2005/0199894 | A1 | 9/2005 | Rinzler et al. |
| 2006/0102921 | A1 | 5/2006 | Wu et al. |
| 2007/0166223 | A1 | 7/2007 | Jiang et al. |
| 2008/0170982 | A1 | 7/2008 | Zhang et al. |
| 2008/0210967 | A1 | 9/2008 | Shen |
| 2008/0248235 | A1 | 10/2008 | Feng et al. |
| 2008/0299031 | A1 | 12/2008 | Liu et al. |
| 2010/0133569 | A1* | 6/2010 | Li et al. ................... 257/98 |

FOREIGN PATENT DOCUMENTS

| CN | 1543399 A | 11/2004 |
| CN | 1734798 A | 2/2006 |
| CN | 101284662 A | 10/2008 |
| CN | 101286540 A | 10/2008 |
| CN | 101314464 A | 12/2008 |
| JP | P2002-353506 A | 12/2002 |
| WO | WO02/076724 A1 | 10/2002 |

OTHER PUBLICATIONS

Jianfeng Li, Liangbing Hu, Lian Wang, Yangxin Zhou, George Gruner, Tobin J. Marks, Organic Light-Emitting Diodes Having Carbon Nanotube Anodes, Nano Letters, vol. 6, No. 11, p. 2472-2477.
R. H. Horng, C. C. Yang, J. Y. Wu, S. H. Huang, C. E. Lee, and D. S. Wuu, GaN-based light-emitting diodes with indium tin Oxide texturing window layers using natural lithography, Applied Physics Letters, vol. 86, 221101 (2005).

* cited by examiner

*Primary Examiner* — Jack Chen
(74) *Attorney, Agent, or Firm* — Altis Law Group, Inc.

(57) ABSTRACT

A method of fabricating a light emitting diode includes the following steps. A substrate is provided and a first semiconductor layer, an active layer, and a second semiconductor layer are placed on the substrate. A carbon nanotube structure is provided and the carbon nanotube structure is lie on the second semiconductor layer. A first electrode is formed on the carbon nanotube structure. A portion of the first semiconductor layer is exposed and a second electrode is formed on the exposed portion of the first semiconductor layer to obtain the light emitting diode.

18 Claims, 4 Drawing Sheets

METHOD FOR FABRICATING LIGHT EMITTING DIODE

RELATED APPLICATIONS

This application is related to applications entitled, "LIGHT EMITTING DIODE", filed U.S. patent application Ser. No. 12/584,417.

BACKGROUND

1. Technical Field

The present disclosure relates to a method for fabricating a light emitting diode (LED).

2. Description of the Related Art

LEDs are semiconductors that convert electrical energy into light. Compared to conventional light sources, the LEDs have higher energy conversion efficiency, higher radiance (i.e., they emit a larger quantity of light per unit area), longer lifetime, higher response speed, and better reliability. At the same time, LEDs generate less heat. Therefore, LED modules are widely used as light sources in optical imaging systems, such as displays, projectors, and so on.

A conventional method of fabricating the LEDs includes the following steps. A GaN bumper layer, a GaN layer, an N-type GaN layer, an active layer and a P-type GaN layer are deposited on a substrate. The active layer is made of InGaN or GaN. The P-type GaN layer and the active layer are etched via inductance-coupling plasma etch process, thereby exposing a surface of the N-type GaN layer. A nickel layer and a gold layer are deposited on a top surface of the P-type GaN layer via electron beam evaporation process. Then, the nickel layer and the gold layer are annealed for 10 minutes, whereby a transparent contact layer forms on the P-type GaN layer. An indium tin oxides (ITO) layer, which functions as transparent conductive film, is sputtered on a portion of the transparent contact layer. A titanium layer and an aluminum layer, which function as electrodes, are formed on the N-type GaN layer and the remaining portion of the transparent contact layer. Finally, the ITO layer is etched via inductance-coupling plasma etch process to roughen a top surface of the ITO layer, thereby improving the light extraction efficiency of the LEDs. In the above method, the ITO layer is formed on the transparent contact layer via sputtering, and then is to etched to roughen the top surface thereof, which results in a complex manufacturing process and a high manufacturing cost.

What is needed, therefore, is a method for fabricating a light emitting diode, which can overcome the above-described shortcomings.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
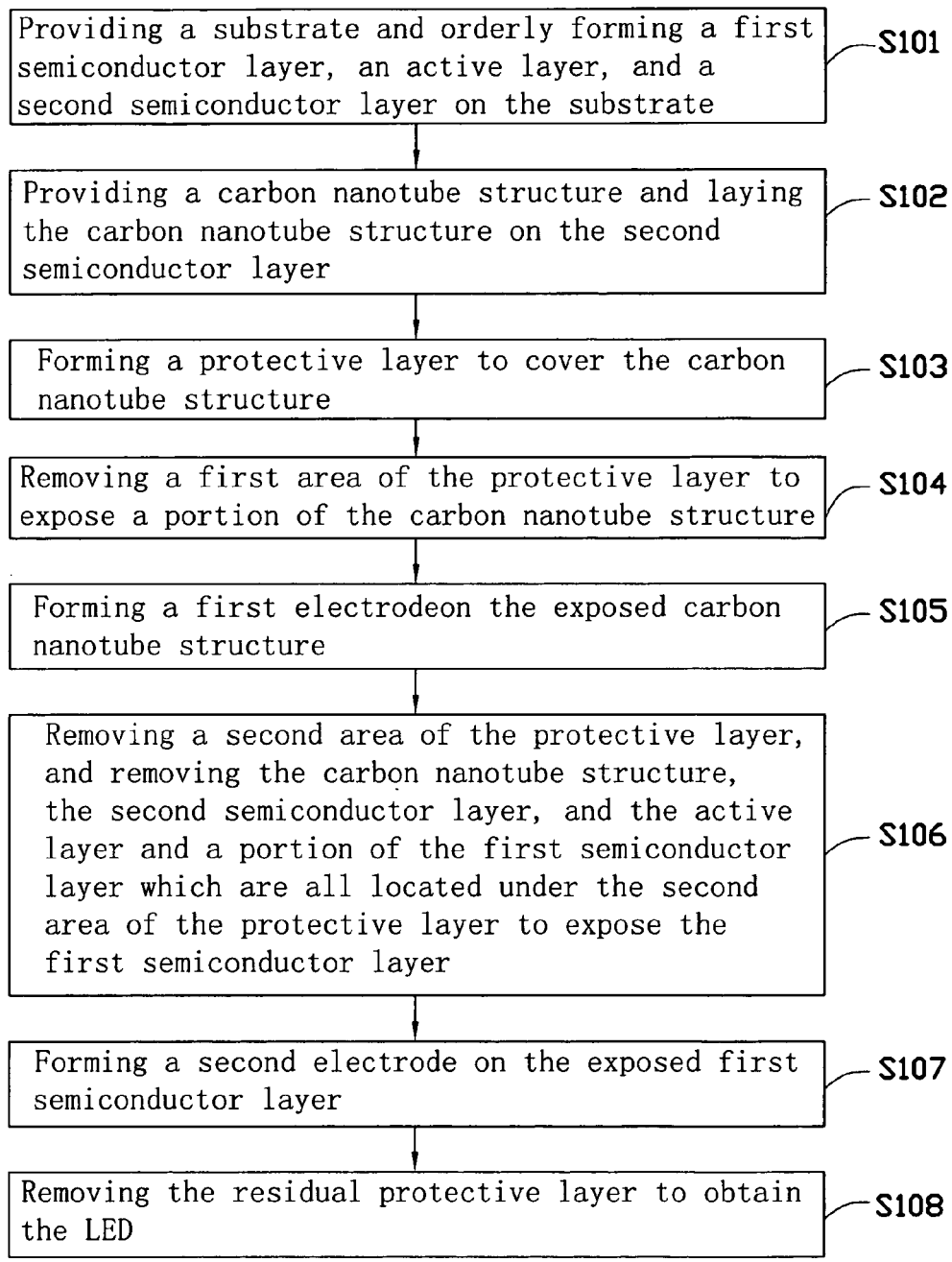
FIG. 1 is a flow chart of a method for manufacturing an LED according to an embodiment.
Figure 2A:
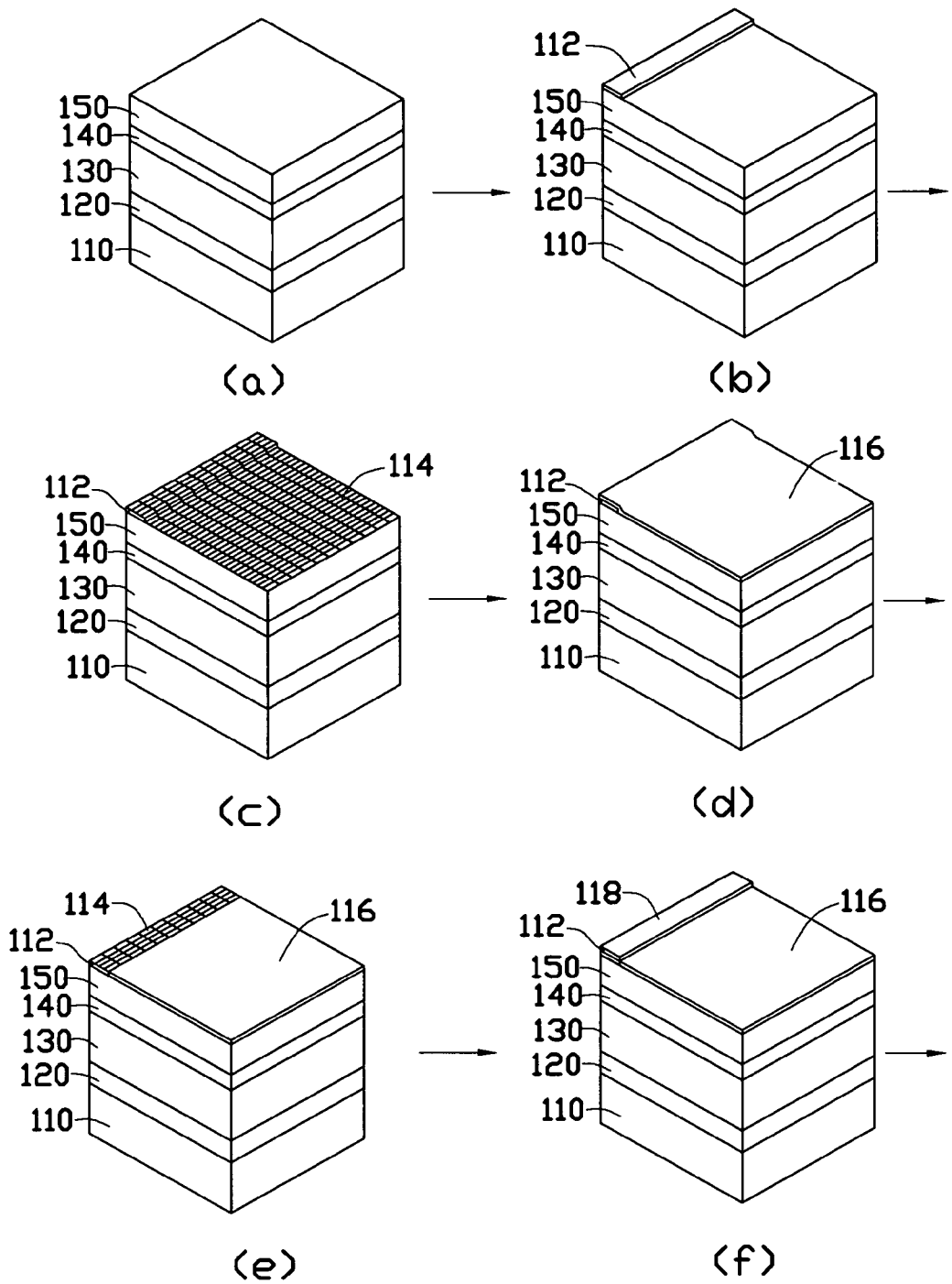
FIGS. 2A-2B are process flow graphs of fabricating the LED of FIG. 1.
Figure 2B:
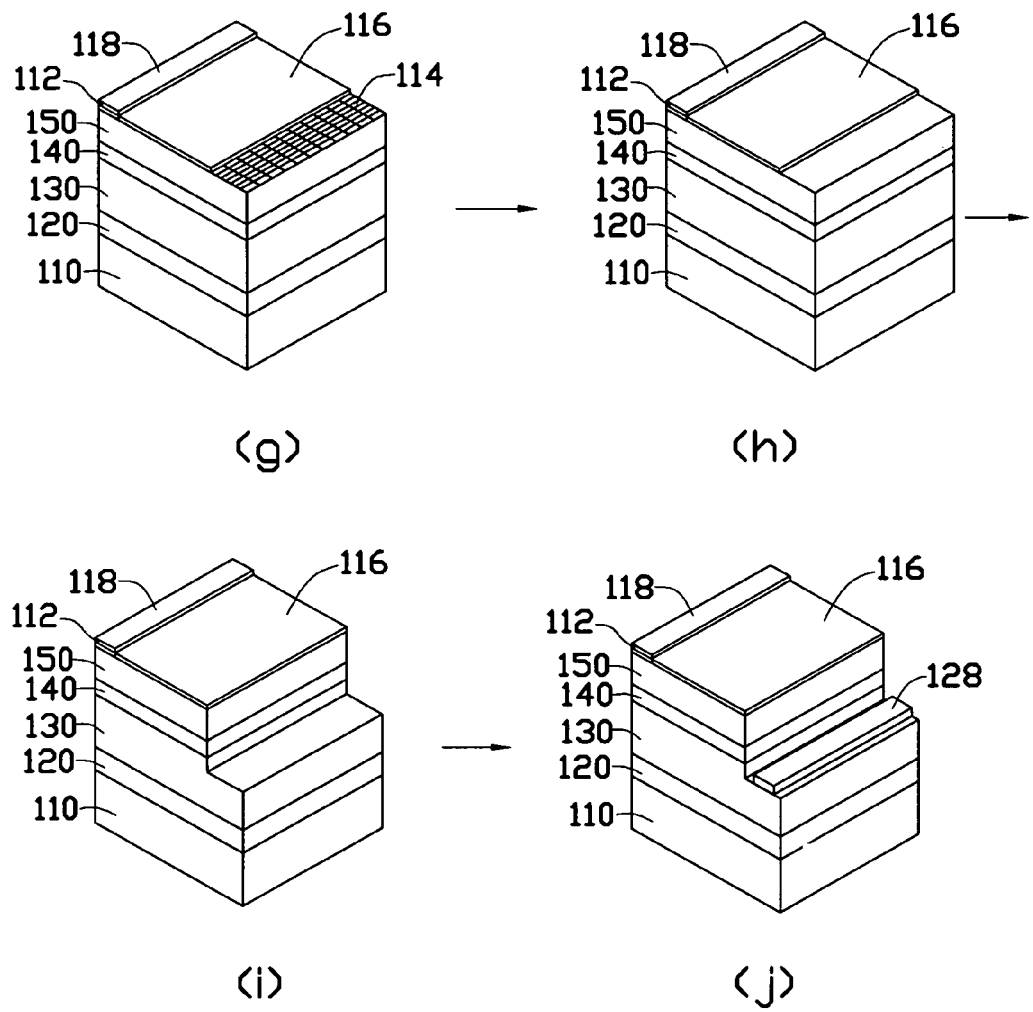

Referring to FIG. 1 and FIGS. 2A-2B, an embodiment of a method for manufacturing an LED includes the following steps:

step S101: providing a substrate 110 and orderly forming a first semiconductor layer 130, an active layer 140, and a second semiconductor layer 150 on the substrate 110;

step S102: providing a carbon nanotube structure 114 and laying the carbon nanotube structure 114 on the second semiconductor layer 150;

step S103: applying a protective layer 116 to cover the carbon nanotube structure 114;

step S104: removing a first area of the protective layer 116 to expose a portion of the carbon nanotube structure 114;

step S105: affixing a first electrode 118 on the exposed portion of the carbon nanotube structure 114;

step S106: removing a second area of the protective layer 116, and removing the carbon nanotube structure 114, the second semiconductor layer 150, and the active layer 140 and a portion of the first semiconductor layer 130 which are all located under the second area of the protective layer 116 to expose a portion of the first semiconductor layer 130;

step S107: placing a second electrode 128 on the exposed portion of the first semiconductor layer 130;

step S108: removing the residual protective layer 116 to obtain the LED.

In step S101, the substrate 110 has a thickness of about 300 microns (μm) to about 500 μm and is a transparent plate for supporting the other elements, such as the first and second semiconductor layers 130, 150. The substrate 110 may be made of sapphire, gallium arsenide, indium phosphate, silicon nitride, gallium nitride, zinc oxide, aluminum silicon nitride, silicon carbon, or their combinations. In one embodiment, the substrate 110 is made of sapphire and has a thickness of 400 μm.

The first semiconductor layer 130, the active layer 140, and the second semiconductor layer 150 are deposited on the substrate 110 via a process of metal organic chemical vapor deposition (MOCVD).

The first semiconductor layer 130 has a thickness of about 1 μm to about 5 μm. The second semiconductor layer 150 has a thickness of about 0.1 μm to about 3 μm. When the first semiconductor layer 130 is N-type semiconductor, the second semiconductor layer 150 is P-type semiconductor, and vice versa. In one embodiment, the first semiconductor layer 130 is an N-type semiconductor and the second semiconductor layer 150 is a P-type semiconductor. The first semiconductor layer 130 is configured to provide electrons, and the second semiconductor layer 150 is configured to provide holes. When a voltage is applied to the first and second semiconductor layers 130, 150, the electrons can flow into the second semiconductor 150 filling the cavities, thereby emitting light. The first semiconductor layer 130 may be made of N-type gallium nitride, N-type gallium arsenide, or N-type copper phosphate. The second semiconductor 150 may be made of P-type gallium nitride, P-type gallium arsenide, or P-type copper phosphate. In one embodiment, the first semiconductor layer 130 is made of N-type gallium nitride and has a thickness of 2 μm, and the second semiconductor layer 150 is made of P-type gallium nitride and has a thickness of 0.3 μm.

The active layer 140, in which the electrons are incorporated with the cavities, has a thickness of about 0.01 μm to about 0.6 μm. The active layer 140 is a photon excitation layer and can be one of a single layer quantum well film or multi-layer quantum well films. The active layer 140 is made of GaInN, AlGaInN, GaSn, AlGaSn, GaInP, or GaInSn. In one embodiment, the active layer 140 has a thickness of 0.3 μm and includes one layer of GaInN and another layer of GaN. The GaInN layer is stacked with the GaN layer.

Further, a functioning layer 120 may be formed between the substrate 110 and the first semiconductor layer 130. The functioning layer 120 may be one or more of a buffer layer, a reflective layer, and a photon crystal structure. The buffer layer is configured to improve epitaxial growth and decrease lattice mismatch. The buffer layer may be made of GaN, AlN, or the like. The reflective layer is configured to change the transmission route of the light to improve extraction efficiency of light in the LED. The reflective layer may be made of silver, aluminum, rhodium, or the like. The photon crystal structure is configured to improve extraction efficiency of light and may be made of silicon, indium tin oxide, carbon nanotube, or the like. In one embodiment, only the buffer layer is formed on the substrate 110 and is made of GaN. The buffer layer has a thickness of about 20 nanometers (nm) to about 50 nm.

Referring to FIG. 2A(b), a static electrode 112 is applied on the top surface of the second semiconductor layer 150. The static electrode 112 may be a P-type electrode or N-type electrode and has a same type with the second semiconductor layer 150. In one embodiment, the static electrode 112 is a P-type electrode. Understandably, the static electrode 112 can function as a reflection layer. The static electrode 112 can have one or more layers of metal and may be made of titanium, aluminum, nickel, gold, or any combinations thereof. In one embodiment, the static electrode 112 has two layers. One layer is made of titanium and has a thickness of 15 nm, and the other layer is made of gold and has a thickness of 100 nm.

The static electrode 112 is placed on the second semiconductor layer 150 via a process of physical vapor deposition, such as electron beam evaporation, vacuum evaporation, ion sputtering, physical deposition, or the like. In one embodiment, the static electrode 112 is formed on the second semiconductor layer 150 via a physical deposition method. The method includes:

step S201: coating a layer of photo resist on the top surface of the second semiconductor layer 150;

step S202: removing a portion of the photo resist to expose the second semiconductor layer 150;

step S202: depositing the static electrode 112 on the top surface of the second semiconductor layer 150 where the layer of photo resist has been removed; and step S203: removing the residual photo resist via an organic solvent, such as acetone to form the static electrode 112.

In step S102, the carbon nanotube structure 114 can be directly applied to the top surface of the second semiconductor layer 150 and the static electrode 112. Referring to FIG. 2A(c), the carbon nanotube structure 114 may cover the residual surface of the second semiconductor layer 150 and fully or partly cover the top surface of the static electrode 112. The carbon nanotube structure 114 may include at least one carbon nanotube film or a number of carbon nanotube wires. The carbon nanotube structure 114 may be a layered structure. There is no particular restriction on the thickness of the carbon nanotube structure 114 and may be appropriately selected depending on the purpose, in one embodiment, the carbon nanotube structure 114 has a thickness of about 0.5 μm to 200 μm.

The carbon nanotube structure 114 includes one or more layers of carbon nanotube films. When the carbon nanotube structure 114 includes a number of carbon nanotube films, the carbon nanotube films are stacked on top of each other. When the carbon nanotube structure 114 employs more carbon nanotube films, the strength will increase. The carbon nanotube film has a thickness in an approximate range from about 0.5 nm to about 100 millimeters (mm). The carbon nanotubes films may have a free-standing structure, e.g. the film structure can sustain itself and does not require a support.

The carbon nanotube films each are formed by the carbon nanotubes, orderly or disorderly, and has substantially a uniform thickness. In the ordered films, the ordered carbon nanotube film is consisted of ordered carbon nanotubes. Ordered carbon nanotube films include films where the carbon nanotubes are arranged along a primary direction. Examples include films wherein the carbon nanotubes are arranged approximately along a same direction or have two or more sections within each of which the carbon nanotubes are arranged approximately along a same direction (different sections can have different directions). In the ordered carbon nanotube films, the approximately all of the carbon nanotubes are oriented along a same preferred orientation and parallel to each other. A film can be drawn from a carbon nanotube array, to form the ordered carbon nanotube film, namely a drawn carbon nanotube film. The drawn carbon nanotube film includes a plurality of successive and oriented carbon nanotubes joined end-to-end by van der Waals attractive force therebetween. The drawn carbon nanotube film is a free-standing film. The carbon nanotube film can be treated with an organic solvent to increase the mechanical strength and toughness of the carbon nanotube film and reduce the coefficient of friction of the carbon nanotube film. A thickness of the carbon nanotube film can range from about 0.5 nm to about 100 mm. Examples of drawn carbon nanotube film are taught by US publication No. 2008/0170982 A1 to Zhang et al.

The ordered carbon nanotube film may be a pressed carbon nanotube film having a number of carbon nanotubes arranged along a same direction. The carbon nanotubes in the pressed carbon nanotube film can rest upon each other. Adjacent carbon nanotubes are attracted to each other and combined by van der Waals attractive force. An angle between a primary alignment direction of the carbon nanotubes and a surface of the pressed carbon nanotube film is 0 degrees to approximately 15 degrees. The greater the pressure applied, the smaller the angle present. The thickness of the pressed carbon nanotube film ranges from about 0.5 nm to about 1 mm. Examples of pressed carbon nanotube film are taught by US application 20080299031A1 to Liu et al.

The disordered carbon nanotube film comprises of the carbon nanotubes arranged in a disorderly fashion. Disordered carbon nanotube films include randomly aligned carbon nanotubes. When the disordered carbon nanotube film comprises of a film wherein the number of the carbon nanotubes aligned in every direction is substantially equal, the disordered carbon nanotube film can be isotropic. The disordered carbon nanotubes can be entangled with each other and/or are substantially parallel to a surface of the disordered carbon nanotube film. The disordered carbon nanotube film may be a flocculated carbon nanotube film. The flocculated carbon nanotube film can include a plurality of long, curved, disordered carbon nanotubes entangled with each other. Further, the carbon nanotubes in the flocculated carbon nanotube film can be isotropic. The carbon nanotubes can be substantially uniformly dispersed in the flocculated carbon nanotube film. Adjacent carbon nanotubes are attracted by van der Waals attractive force to form an entangled structure with micropores defined therein. It is understood that the flocculated carbon nanotube film is very porous. Sizes of the micropores can be less than 10 micrometers. Due to the carbon nanotubes in the flocculated carbon nanotube film being entangled with each other, the carbon nanotube structure 114 employing the flocculated carbon nanotube film has excellent durability, and can be fashioned into desired shapes with a low risk to the integrity of the flocculated carbon nanotube film. The thickness of the flocculated carbon nanotube film can range from about 0.5 nm to about 1 mm.

The disordered carbon nanotube film may be a pressed carbon nanotube film having a number of carbon nanotubes arranged along different directions. The pressed carbon nanotube film can be a free-standing carbon nanotube film. When the carbon nanotubes in the pressed carbon nanotube film are arranged along different directions, the pressed carbon nanotube film can be isotropic. As described above, the thickness of the pressed carbon nanotube film ranges from about 0.5 nm to about 1 mm. Examples of pressed carbon nanotube film are taught by US application 20080299031A1 to Liu et al.

Length and width of the carbon nanotube film can be set as desired. A thickness of the carbon nanotube film is in a range from about 0.5 nm to about 100 mm. The carbon nanotubes in the carbon nanotube film can be single-walled, double-walled, multi-walled carbon nanotubes, and combinations thereof. Diameters of the single-walled carbon nanotubes, the double-walled carbon nanotubes, and the multi-walled carbon nanotubes can, respectively, be in the approximate range from about 0.5 to about 50 nanometers, about 1 to about 50 nanometers, and about 1.5 to about 50 nanometers.

The carbon nanotube structure 114 may be constructed by a number of carbon nanotube wires. The carbon nanotube wires may coat side by side on the top surface of the second semiconductor layer or may be weaved into a carbon nanotube layer. The weaved carbon nanotube layer is located on the second semiconductor layer. The carbon nanotube wire includes untwisted carbon nanotube wire and twisted carbon nanotube wire. The untwisted carbon nanotube wire includes a number of carbon nanotubes substantially parallel to each other. The twisted carbon nanotube wire includes a number of carbon nanotubes twisted along a longitudinal axis of the twisted carbon nanotube wire.

The untwisted carbon nanotube wire can be formed by treating the drawn carbon nanotube film with an organic solvent. The drawn carbon nanotube film is treated by applying the organic solvent to the carbon nanotube film to soak the surface of the drawn carbon nanotube film without being adhered on a substrate. After being soaked by the organic solvent, the adjacent paralleled carbon nanotubes in the drawn carbon nanotube film will bundle together, due to the surface tension of the organic solvent when the organic solvent volatilizing, and thus, the drawn carbon nanotube film will shrink into untwisted carbon nanotube wire. Examples of the untwisted carbon nanotube wire are taught by U.S. Pat. No. 7,045,108 to Fan et al. and US publication No. 20070166223 A1 to Fan et al.

The twisted carbon nanotube wire can be formed by twisting a drawn carbon nanotube film by using a mechanical force to turn the two ends of the drawn carbon nanotube film in opposite directions. Further, the twisted carbon nanotube wire can be treated by applying the organic solvent thereon. After being soaked by the organic solvent, the adjacent paralleled carbon nanotubes in the twisted carbon nanotube film will bundle together, due to the surface tension of the organic solvent when the organic solvent volatilizing. The treated twisted carbon nanotube wire may have less specific surface area, and greater density and strength than a non-treated twisted carbon nanotube wire.

In one embodiment, two drawn carbon nanotube films are coated on the second semiconductor layer 150 and the static electrode 112. An angle between the primary directions of the two drawn carbon nanotube films ranges from about 0 degrees to about 90 degrees. In one embodiment, the primary directions of the two drawn carbon nanotube films are perpendicular to each other. A method of coating the two drawn carbon nanotube films includes the following steps. A first drawn carbon nanotube film is drawn from a super-aligned carbon nanotube array. The first drawn carbon nanotube film is coated on the second semiconductor layer 150 and the static electrode 112. A second carbon nanotube film is drawn from a super-aligned carbon nanotube array. The second drawn carbon nanotube film is applied so that the primary direction of the first carbon nanotube film is perpendicular to that of the second carbon nanotube film. Understandably, the first and second drawn carbon nanotube films can directly adhere on the second semiconductor layer 150 and the static electrode 112 due to the carbon nanotube films have strong adhesive properties.

In step S103, the protective layer 116 may be made of insulating material, semiconductor material, or metal material. The protective layer 116 may have a thickness of about 10 nm to about 100 nm. The protective layer 116 covers the carbon nanotube structure 114 and secures it. The protective layer 116 is deposited on the carbon nanotube structure 114 by a method, e.g. electron beam evaporation, magnetron sputtering or chemical vapor deposition. In one embodiment, a layer of silicon dioxide functioning as the proactive layer 116 is deposited on the carbon nanotube structure 114 via chemical vapor deposition. The silicon dioxide layer has a thickness of about 50 nm.

In step S104, referring to FIG. 2A(e), the etched first area of the protective layer 116 may be a rectangular, circular, triangular or any other shape. The etched first area may be located on the periphery of the protective layer 116 or the center of the protective layer 116. In one embodiment, since the LED has the static electrode 112, the first area of the protective layer 116 above the static electrode 112 is etched. The first area of the protective layer 116 may be removed via wet etching. In one embodiment, a buffered oxide etch (BOE) is employed as etching medium. The BOE is composed of high concentration of hydrofluoric acid solution and fluorinated ammonia buffer. Understandably, when the area of the protective layer 116 can be controlled in the deposition thereof, the carbon nanotube film 114 above the static electrode 112 cannot be covered with the protective layer 116. A method of etching the protective layer 116 utilizing the BOE includes:

step S301: uniformly coating a layer of photo resist on the protective layer 116;

step S302: removing the layer of photo resist above the static electrode 112 via radiographic exposure process to expose the first area of the protective layer 116;

step S303: providing a container having the BOE therein;

step S304: immersing the exposed protective layer 116 into the BOE to etch it; and step S305: washing the LED and removing the residual BOE.

In step S105, the first electrode 118 may be P-type or N-type electrode and has a same type as the static electrode 112 and the second semiconductor 150 In one embodiment the static electrode 112 and the second semiconductor 150 are made of P-type material, and the first electrode 118 is a P-type electrode. When the LED has the static electrode 112, the first electrode 118 can be located above the static electrode 112. When the LED has no the static electrode 112, the first electrode 118 can be located on any position of the exposed carbon nanotube structure 114. In one embodiment, since the LED employs the static electrode 112, the first electrode 118 is located above the static electrode 112. The first electrode 118 and the static electrode 112 function together as the P-type electrode of the LED.

The first electrode 118 is deposited on the carbon nanotube structure 114 via physical vapor deposition and may have single-layered structure or multi-layered structure. The first electrode 118 can be made of titanium or gold. In one embodiment, the first electrode 118 includes two layers, one layer is titanium and has a thickness of 15 nm and another layer is gold and has a thickness of 200 nm. A portion of the carbon nanotube structure 114 is sandwiched between the static electrode 112 and the first electrode 118.

In step S106, a method of removing a second area of the protective layer 116, the carbon nanotube structure 114, the second semiconductor layer 150, the active layer 140, and a portion of the first semiconductor layer 130 to expose another portion of the first semiconductor layer 130. The removed carbon nanotube structure 114, the second semiconductor 150, the active layer 140, and a portion of the first semiconductor layer 130 are all located under the second area of the protective layer 116. The method includes:

step S401: etching the second area of the protective layer 116 via a process of wet-etching to expose the carbon nanotube structure 114;

step S402: etching the exposed carbon nanotube structure 114 under the second area of the protective layer 116 by oxide plasma etching to expose the second semiconductor layer 150; and step S403: etching the exposed second semiconductor layer 150, the active layer 140 and a portion of the first semiconductor layer 130 by reactive ion etching method to expose the first semiconductor layer 130.

In step S401, the method of etching the second area of the protective layer 116 is the same as that of etching the first area thereof.

In step S402, the LED having the exposed carbon nanotube structure 114 is placed into a microwave induced plasma (MIP) device to etch the carbon nanotube structure 114. An induction power source of the MIP device emits oxide plasma. The oxide plasma has low ion power and etches the exposed carbon nanotube structure 114 for about 2 minutes to about 8 minutes, whereby, the exposed carbon nanotube structure 114 is etched and a portion of the second semiconductor layer 150 is exposed. In one embodiment, the power of the MIP device is 60 W and the speed of the oxide plasma is 40 sccm (standard-sate cubic centimeter per minute). The partial pressure of the oxide plasma is 2 Pa.

In step S403, the LED having the exposed second semiconductor layer 150 is placed into an inductively coupled plasma device and a mixture of silicon tetrachloride and chlorine is added into the inductively coupled plasma device to etch the exposed second semiconductor layer 150, the active layer 140 and the first semiconductor layer 130. In one embodiment, the power of the inductively coupled plasma device is 50 W, the speed of the chlorine is 26 sccm, and the speed of the silicon tetrachloride is 4 sccm. The partial pressure of the silicon tetrachloride and chlorine is 2 Pa. The etched thickness of the first semiconductor layer 130 is about 0.2 μm.

The second electrode 128 has a same type as the first semiconductor layer 130 and may be made of N-type material. Referring to FIG. 2B(j), the second electrode 128 is deposited on the step of the first semiconductor layer 130. The second electrode 128 has a same structure with the first electrode and includes a titanium layer and a gold layer overlapped with the titanium layer. The titanium layer has a thickness of about 15 nm and the gold layer has a thickness of about 200 nm. The method of depositing the second electrode 128 is the same as that of the first electrode 118. Understandably, the first and second electrodes 118, 128 can be deposited at the same time.

In step S108, the method of removing the residual protective layer 116 is selected depending on the material of the protective layer 116. In one embodiment, the silicon dioxide layer functioning as the protective layer 116 is removed by wet-etching method.

The method of fabricating the LED further includes steps of forming a metal layer (not shown) on the carbon nanotube structure 114 and heating the metal layer in a temperature of about 300 degrees centigrade to about 500 degrees centigrade for about 3 minutes to about 10 minutes after removing the protective layer 116. The metal layer may be a single-layered structure or a multi-layered structure. In one embodiment, the metal layer includes a nickel layer stacked with a gold layer. The nickel layer has a thickness of about 2 nm, and the gold layer has a thickness of 5 nm. Since the metal layer is thin, when heating, the metal molecules of the metal layer can aggregate into a number of metal particles because of surface tension of the metal layer. The carbon nanotube structure has a plurality of micropores. These metal particles uniformly disperse in the micropores of the carbon nanotube structure 114 to form a composite film. The composite film has a better electrical conductive capacity than the pure carbon nanotube structure 114, thereby improving current injection efficiency and electrical contact between the carbon nanotube structure 114 and the static electrode 112, the first electrode 118, and the second semiconductor layer 150.

Figure 3:
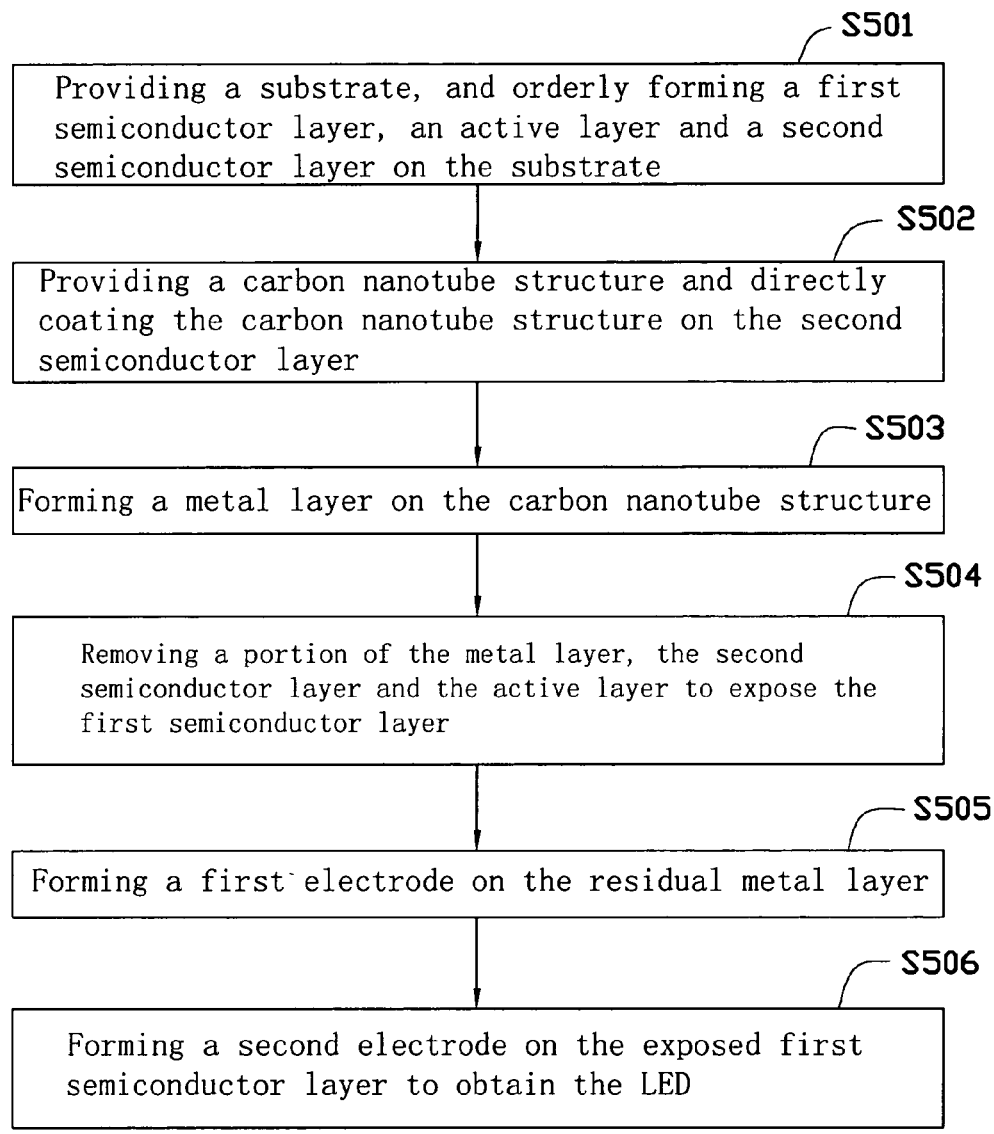
FIG. 3 is a flow chart of a method for manufacturing an LED according to another embodiment.

Referring to FIG. 3, a method of fabricating an LED includes:

step S501: providing a substrate, and orderly forming a first semiconductor layer, an active layer, and a second semiconductor layer on the substrate;

step S502: providing a carbon nanotube structure and directly laying the carbon nanotube structure on the second semiconductor layer;

step S503: forming a metal layer on the carbon nanotube structure;

step S504: removing a portion of the metal layer, the second semiconductor layer and the active layer to expose the first semiconductor layer;

step S505: forming a first electrode on the residual metal layer; and step S506: forming a second electrode on the exposed first semiconductor layer to obtain the LED.

The method of fabricating the LED further includes a step of forming a static electrode on the top surface of the second semiconductor layer. As described above, in one embodiment, the substrate is made of sapphire. The first semiconductor layer is made of N-type gallium nitride and has a thickness of about 2 μm. The second semiconductor layer is made of P-type gallium nitride and has a thickness of about 0.3 μm. The static electrode is a P-type electrode and includes a titanium layer and a gold layer overlapped with the titanium layer. The titanium layer has a thickness of 15 nm. The gold layer has a thickness of 200 nm. Steps S501 and S502 are substantially the same as steps S101 and S102.

In step 503, the metal layer is made of nickel, gold, titanium, or the like and deposited on the carbon nanotube structure by physical vapor deposition. The metal layer may be a single-layer structure or a multi-layered structure. The metal layer may function as a protective layer to prevent the carbon nanotubes of the carbon nanotube structure from falling off or entangling with each other. The metal layer has a thickness of about 5 nm to about 8 nm. When the metal layer is thin, it may have a high light-transmitting efficiency in addition to good electrical conductivity. Furthermore, the metal layer can be retained in the carbon nanotube structure and no need to be etched. In one embodiment, the metal layer includes a nickel layer and a gold layer stacked with the nickel layer. The nickel layer has a thickness of about 2 nm, and the gold layer has a thickness of about 5 nm.

In step S504, the metal layer is etched by a process of wet-etching to expose the carbon nanotube structure. The exposed carbon nanotube structure is etched by oxide plasma etching to expose the second semiconductor layer. The exposed second semiconductor layer, the active layer and a portion of the first semiconductor layer is etched by reactive ion etching method to expose the first semiconductor layer. Steps S505 and S506 are similar to steps S105 and S107, thus, the detailed description of step S505 and S506 are omitted.

As a result, the LED having a carbon nanotube structure employed as the transparent conductive film, and the carbon nanotube structure can be directly applied on the top surface of the second semiconductor layer. This is a comparatively simple process. Furthermore, the protective layer or the metal layer is located on the carbon nanotube structure, and the protective layer or the metal layer can fix the carbon nanotube structure, thereby preventing damage to the carbon nanotube structure. Thus, the manufacture cost is decreased and the quality of the LED is improved.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

It is also to be understood that above description and the claims drawn to a method may include some indication in reference to certain steps. However, the indication used is only to be viewed for identification purposes and not as a suggestion as to an order for the steps.

What is claimed is:

1. A method of fabricating a light emitting diode, comprising:
   providing a carbon nanotube structure and a substrate having a first semiconductor layer, an active layer, and a second semiconductor layer on the substrate;
   laying the carbon nanotube structure on the second semiconductor layer;
   placing a first electrode on the carbon nanotube structure;
   exposing a portion of the first semiconductor layer; and
   placing a second electrode on the exposed portion of the first semiconductor layer.

2. The method of claim 1, after laying the carbon nanotube structure on the second semiconductor layer, further comprising steps of forming a protective layer to cover and fix the carbon nanotube structure and removing a first area of the protective layer to expose an exposed portion of the carbon nanotube structure; wherein the first electrode is placed on the exposed portion of the carbon nanotube structure, and the protective layer is made of insulating material, semiconductor material, or metal material.

3. The method of claim 2, wherein the first area of the protective layer is removed by wet-etching process to expose the exposed portion of the carbon nanotube structure.

4. The method of claim 2, wherein a second area of the protective layer is removed, and the carbon nanotube structure, the second semiconductor layer, the active layer and a portion of the first semiconductor layer under the second area of the protective layer is removed to expose the exposed portion of the first semiconductor layer.

5. The method of claim 4, wherein the carbon nanotube structure under the second area is removed by oxide plasma etching.

6. The method of claim 4, wherein the second semiconductor layer, the active layer and the portion of the first semiconductor layer corresponding to the second area of the protective layer are removed by reactive ion etching.

7. The method of claim 1, further comprising a step of removing the residual protective layer after forming the second electrode on the exposed portion of the first semiconductor layer.

8. The method of claim 7, further comprising steps of forming a metal layer on the carbon nanotube structure and annealing the metal layer in a temperature of about 300 degrees centigrade to about 500 degrees centigrade for about 3 minutes to about 10 minutes.

9. The method of claim 1, further comprising a step of forming a static electrode on the top surface of the second semiconductor layer before forming the carbon nanotube structure on the second semiconductor layer.

10. The method of claim 1, wherein the carbon nanotube structure comprises at least one drawn carbon nanotube film, the at least one drawn carbon nanotube film is drawn from a carbon nanotube array, the at least one drawn carbon nanotube film comprises a plurality of carbon nanotubes substantially arranged along a primary direction, each of the carbon nanotubes is substantially parallel to the top surface of the second semiconductor layer.

11. The method of claim 10, wherein the carbon nanotube structure comprises two or more drawn carbon nanotube films, an angle between the primary directions of the two adjacent drawn carbon nanotube films ranges from about 0 degrees to about 90 degrees.

12. The method of claim 1, wherein the carbon nanotube structure comprises of a layered structure and has a thickness of greater than 0.5 nanometers.

13. A method of fabricating a light emitting diode, comprising:
   providing a carbon nanotube structure, a substrate having a first semiconductor layer, an active layer, and a second semiconductor layer, formed thereon;
   applying the carbon nanotube structure on the second semiconductor layer;
   affixing a metal layer on the carbon nanotube structure;
   exposing a portion of the first semiconductor layer; and
   placing a first electrode on the metal layer and a second electrode on the exposed portion of the first semiconductor layer.

14. The method of claim 13, wherein the metal layer comprises of a material selected from the group consisting of nickel, gold, and titanium.

15. The method of claim 13, wherein the metal layer is deposited on the carbon nanotube structure by physical vapor deposition.

16. The method of claim 13, wherein the metal layer is a single-layered structure or a multi-layered structure.

17. The method of claim 13, wherein the metal layer has a thickness of about 5 nanometers to about 8 nanometers.

18. The method of claim 13, wherein the metal layer includes a nickel layer and a gold layer, the nickel layer has a thickness of about 2 nanometers, and the gold layer has a thickness of about 5 nanometers.

* * * * *